(12) United States Patent
Olson et al.

(10) Patent No.: US 8,013,619 B2
(45) Date of Patent: Sep. 6, 2011

(54) SYSTEM AND METHOD FOR PERFORMING A CONTINUITY TEST ON A LIGHTNING CONDUCTION SYSTEM OF A WIND TURBINE

(75) Inventors: Steven Haines Olson, Greer, SC (US); Debasish Mishra, Bangalore (IN); Peter James Fritz, Greenville, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/955,412

(22) Filed: Nov. 29, 2010

(65) Prior Publication Data

US 2011/0140724 A1    Jun. 16, 2011

(51) Int. Cl.
*G01R 27/08* (2006.01)
*G01R 31/02* (2006.01)

(52) U.S. Cl. .......................... 324/722; 324/72; 361/117

(58) Field of Classification Search .................. None
See application file for complete search history.

(56) References Cited

U.S. PATENT DOCUMENTS

| 4,146,967 | A | 4/1979 | Rohner et al. |
| 7,508,186 | B2 * | 3/2009 | Mortensen ...................... 324/72 |
| 7,806,657 | B2 * | 10/2010 | Schram et al. .................. 416/61 |
| 2006/0175465 | A1 | 8/2006 | Teichert |
| 2007/0056801 | A1 | 3/2007 | Iversen |

* cited by examiner

*Primary Examiner* — Minh N Tang
(74) *Attorney, Agent, or Firm* — Dority & Manning, P.A.

(57) ABSTRACT

A system and method for performing a continuity test on a lightning conduction system of a wind turbine are disclosed. The system generally includes a testing device having a blade ring configured to be positioned around at least a portion of an outer perimeter of a rotor blade of the wind turbine. A carriage may be attached to the testing device and a cable may be attached to the carriage. The cable may generally extend between a first anchor point and a second anchor point, wherein the anchor points are spaced apart from one another such that a lightning receptor of the lightning conduction system is disposed between the anchor points. Additionally, the cable may be coupled between the anchor points such that, as the cable is displaced, the testing device is moved to a position at which an electrically conductive member of the testing device contacts the lightning receptor.

20 Claims, 4 Drawing Sheets

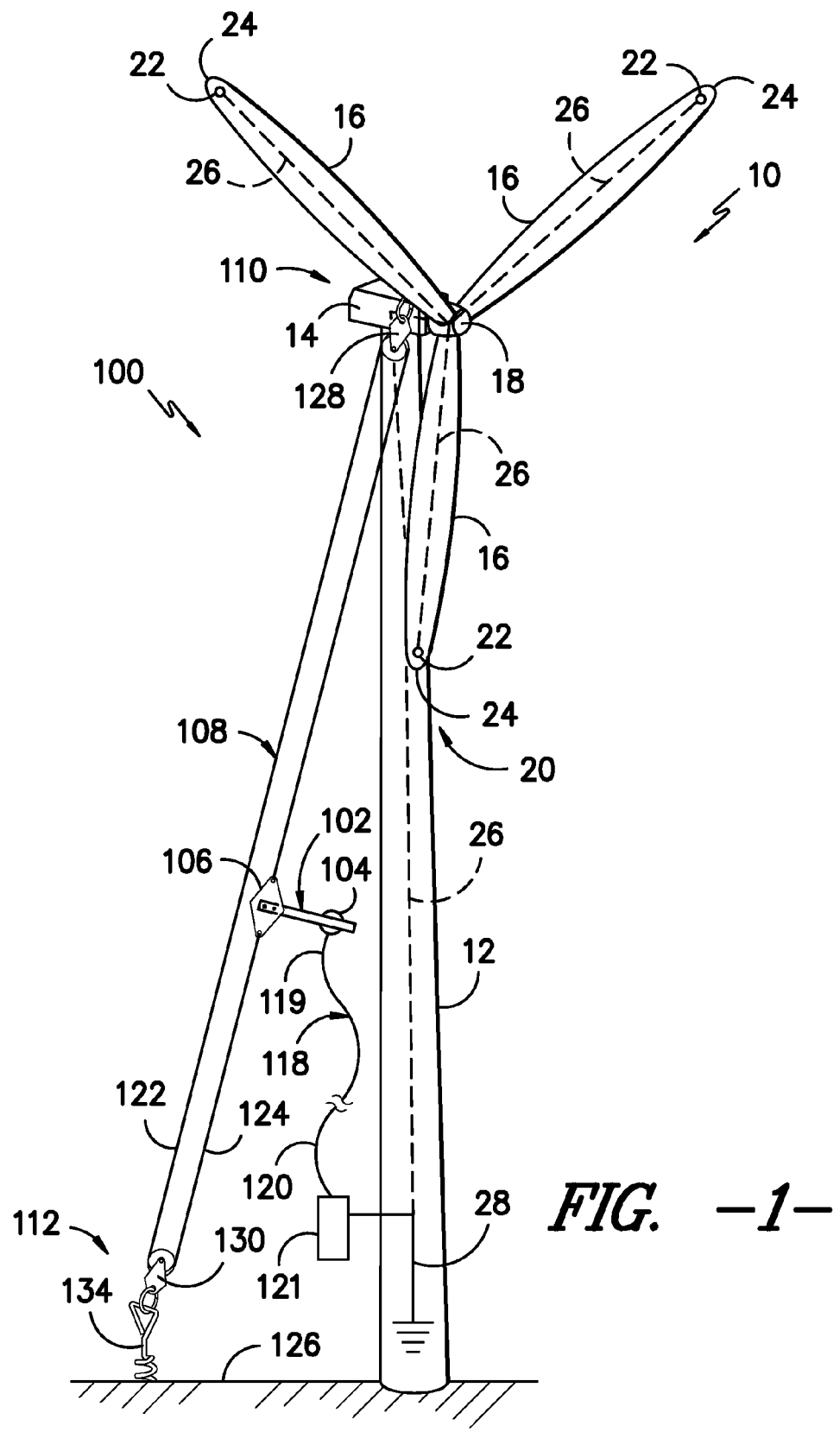
FIG. —1—

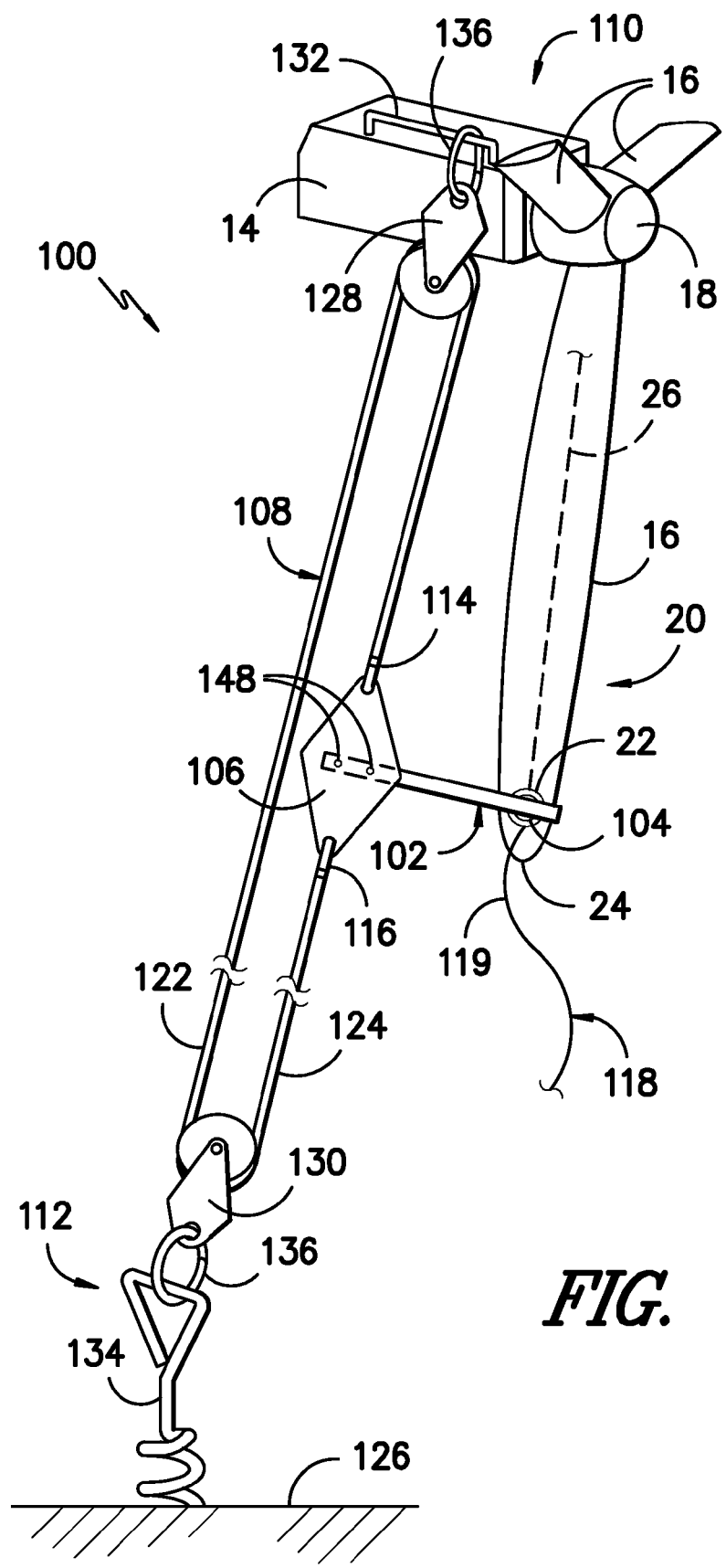
FIG. -2-

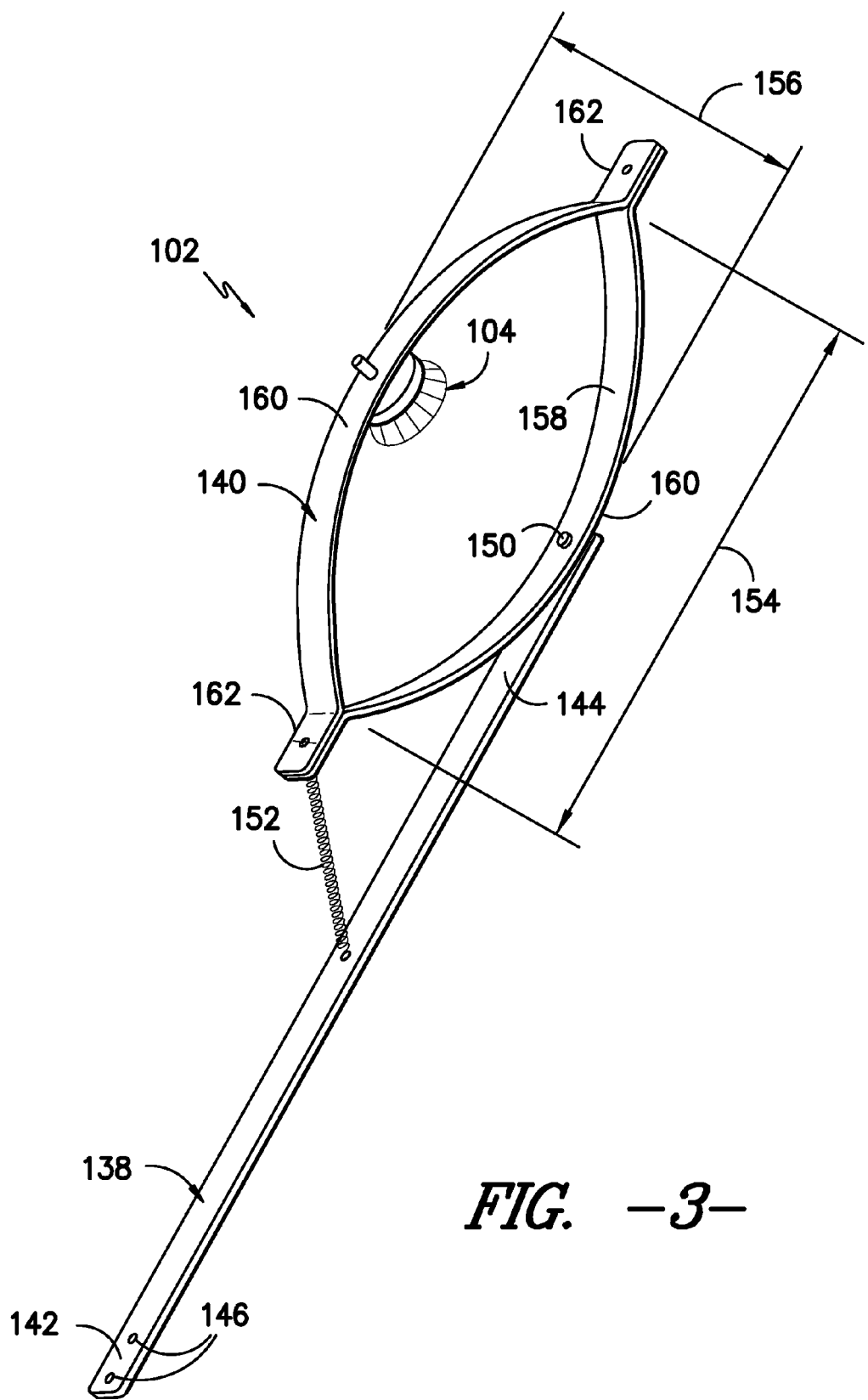
FIG. -3-

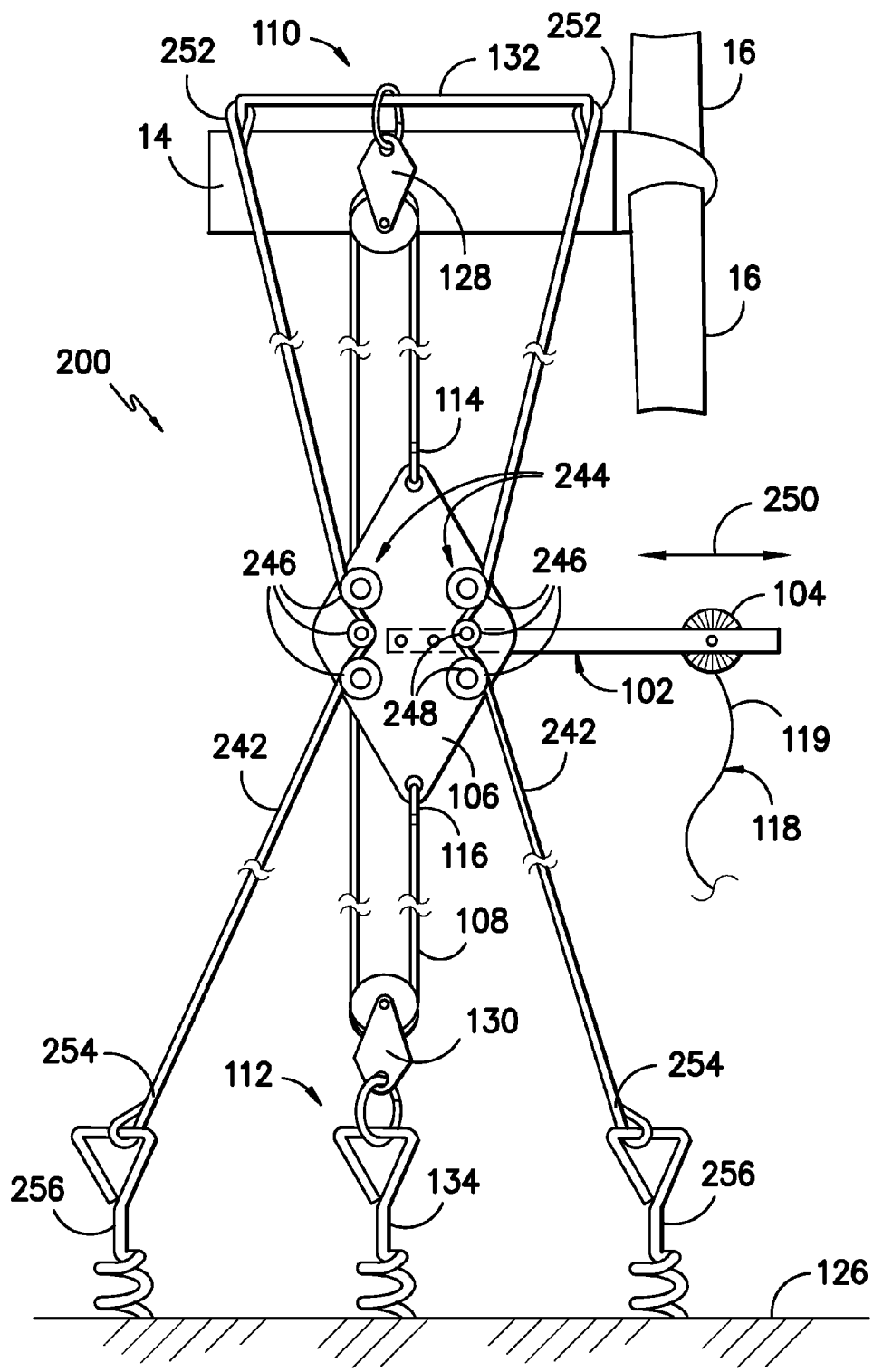
FIG. -4-

SYSTEM AND METHOD FOR PERFORMING A CONTINUITY TEST ON A LIGHTNING CONDUCTION SYSTEM OF A WIND TURBINE

FIELD OF THE INVENTION

The present subject matter relates generally to wind turbines and, more particularly, to a system and method for performing a continuity test on a lightning conduction system of a wind turbine.

BACKGROUND OF THE INVENTION

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy from wind using known foil principles and transmit the kinetic energy through rotational energy to turn a shaft coupling the rotor blades to a gearbox, or if a gearbox is not used, directly to the generator. The generator then converts the mechanical energy to electrical energy that may be deployed to a utility grid.

In general, maintenance operations are routinely performed on wind turbine components to ensure the safe and efficient operation of the wind turbine. For example, one such maintenance operation is a continuity test of the lightning conduction system of a wind turbine. As is generally known, wind turbines typically include a lightning conduction system having one or more lightning receptors disposed on the exterior of the rotor blades and a lightning conductor coupled to the lightning receptor(s) and extending through the wind turbine to a ground located near the tower. Thus, when lightning strikes the rotor blade, the electrical current may flow through the lightning receptor and may be conducted through the lightning conductor to the ground.

Accordingly, to ensure that the lightning conduction system is operating properly, a continuity test is performed to determine whether the electrical circuit formed by the system is open or closed. To perform such a test, it is generally necessary for a service/maintenance worker to gain access to one of the lightning receptors of the lightning conduction system such that electrical testing equipment may be coupled between the lightning receptor and a portion of the lightning conductor of the lightning conduction system disposed adjacent to the ground. As such, known testing procedures require that the worker be sent up in a crane or other suitable equipment in order to permit access to the lightning receptor. However, such equipment is generally very expensive to purchase and operate. Additionally, the process of transporting the worker up to the location of the lightning receptor can be very time consuming.

Accordingly, there is a need for an effective and low cost system for performing a continuity test on the lightning conduction system of a wind turbine.

BRIEF DESCRIPTION OF THE INVENTION

Aspects and advantages of the invention will be set forth in part in the following description, or may be obvious from the description, or may be learned through practice of the invention.

In one aspect, the present subject matter discloses a system for performing a continuity test on a lightning conduction system of a wind turbine. The system generally includes a testing device having a blade ring and an electrically conductive member attached to the blade ring. The blade ring may be configured to be positioned around at least a portion of an outer perimeter of a rotor blade of the wind turbine. The system may also include a carriage attached to the testing device and a cable attached to the carriage. The cable may generally extend between a first anchor point and a second anchor point, wherein the anchor points are spaced apart from one another such that a lightning receptor of the lightning conduction system is generally disposed between the anchor points. Additionally, the cable may be coupled between the anchor points such that, as the cable is displaced, the testing device is moved to a position at which the electrically conductive member contacts the lightning receptor.

In another aspect, the present subject matter discloses a method for performing a continuity test on a lightning conduction system. The method may generally include coupling a cable between a first anchor point and a second anchor point, wherein the anchor points are spaced apart from one another such that a lightning receptor of the lightning conduction system is generally disposed between the anchor points. Additionally, the method may include coupling the cable to a testing device and displacing the cable so that the testing device is moved to a position between the first and second anchor points at which an electrically conductive member of the testing device contacts the lightning receptor.

In a further aspect, the present subject matter discloses a testing device for performing a continuity test on the lightning conduction system of a wind turbine. The testing device may generally include a support member and a blade ring attached to the support member. The blade ring may be configured to be positioned around at least a portion of an outer perimeter of a rotor blade of the wind turbine. Additionally, an electrically conductive member may be attached to an inner surface of the blade ring. The electrically conductive member may be configured to contact a lightning receptor of the lightning conduction system when the blade ring is positioned around the outer perimeter of the rotor blade.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a perspective view of an embodiment of a system for performing a continuity test on a lightning conduction system of a wind turbine in accordance with aspects of the present subject matter;

FIG. 2 illustrates a partial perspective view of the embodiment of the system illustrated in FIG. 1;

FIG. 3 illustrates a perspective view of one embodiment of a testing device for performing a continuity test on the lightning conduction system of a wind turbine in accordance with aspects of the present subject matter; and, FIG. 4 illustrates a partial front view of another embodiment of a system for performing a continuity test on a lightning conduction system of a wind turbine in accordance with aspects of the present subject matter.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Referring to the drawings, FIGS. 1 and 2 illustrate one embodiment of a system 100 for performing a continuity test on the lightning conduction system 20 of a wind turbine 10 in accordance with aspects of the present subject matter. In particular, FIG. 1 illustrates a perspective view of one embodiment of the disclosed system 100. FIG. 2 illustrates a partial, perspective view of the embodiment of the system 100 shown in FIG. 1.

Referring particularly to FIG. 1, the illustrated wind turbine 10 generally includes a tower 12 with a nacelle 14 mounted thereon. Additionally, a plurality of rotor blades 16 may be mounted to a rotor hub 18, which may be, in turn, connected to a main flange that turns a rotor shaft of the wind turbine 10. Further, the wind turbine power generation and control components (e.g., a generator and a turbine controller) may generally be housed within the nacelle 14.

The wind turbine 10 may also include a lightning conduction system 20 configured to protect the wind turbine 10 and its components from lightning strikes. Specifically, the lightning conduction system 20 may include one or more electrically conductive lightning receptors 22 generally disposed on an exterior surface of each rotor blade 16. For example, in one embodiment, the lightning conduction system 20 may include a single lightning receptor 22 disposed generally adjacent to the tip 24 of each of rotor blade 16. In other embodiments, the lightning conduction system 20 may include any number of lightning receptors 22 disposed at any suitable locations along the span of each rotor blade 16. It should be appreciated that each lightning receptor 22 may generally be formed from any suitable electrically conductive material so as to permit the lightning receptors 22 to conduct the electrical current resulting from a lightning strike. For example, in one embodiment, the lightning receptors 22 may comprise copper lightning receptors. Additionally, each lightning receptor 22 may generally be coupled to a suitable lightning conductor 26 (e.g., a metal wire or any other suitable electrically conducing wire) running from each receptor 22 through the wind turbine 10 to the base of the tower 12, where it is connected to a ground 28. As such, when a lightning strike occurs, the electrical current from the strike may flow through the lightning receptor 22 and may be conducted through the lightning conductor 26 to the ground 28 thereby preventing damage to the wind turbine 10.

It should be appreciated that the wind turbine 10 of FIG. 1 is generally provided for illustrative purposes only to place the present subject matter in an exemplary field of use. Thus, one of ordinary skill in the art should appreciate that the disclosed system 100 need be not limited to any particular type of wind turbine configuration or any particular lightning conduction system configuration.

To ensure that the lightning conduction system 20 is operating properly, a continuity test may be performed using the presently disclosed system 100. As shown in FIGS. 1 and 2, the system 100 of the present subject matter may generally include a continuity testing device 102 and a carriage 106 configured to transport the testing device 102 vertically relative to the wind turbine 10. In general, the testing device 102 may be configured such that, when properly positioned relative to a rotor blade 16 of the wind turbine 10, an electrically conductive member 104 of the testing device 102 may form an electrical connection or may otherwise electrically contact one of the lightning receptors 22 disposed on the blade 16. The system 100 may also include a pulley cable 108 secured to the carriage 106. The pulley cable 108 may generally be coupled between a first anchor point 110 and a second anchor point 112, wherein the first and second anchor points 110, 112 are spaced apart from one another such that the lightning receptor 22 to be contacted by the electrically conductive member 104 is disposed between the first and second anchor points 110, 112. Thus, as shown in FIG. 2, when the pulley cable 108 is displaced (such as by being pulled), the carriage 106 may be raised and/or lowered between the first and second anchor points 110, 112 to a location generally adjacent to the rotor blade 16 such that the electrically conductive member 104 may contact and, thus, form an electrical connection with the lightning receptor 22.

The disclosed system 100 may also include an extension wire 118 (e.g., a metal wire or any other suitable wire formed from a electrically conductive material) having a first end 119 connected to the electrically conductive member 104 of the testing device 102 and a second end 120 disposed at or adjacent to a support surface 126 of the wind turbine 10. The extension wire 118 may generally be configured to extend from the electrically conductive member 104 to the support surface 126 to permit a service/maintenance worker located on or adjacent to the support surface 126 to test the continuity of the lightning conduction system 20. In particular, when an electrical connection is made between the electrically conductive member 104 and the lightning receptor 22, an electrical circuit is formed between the wire 118 and the ground 28. Thus, it should be appreciated by those of ordinary skill in the art that the electrical properties of the circuit (e.g., the resistance) may then be tested/measured in order to determine whether the lightning conduction system 20 is properly conducting electrical current from the lightning receptor 22 through the lightning conductor 26 to the ground 28. For example, as shown in FIG. 1, the electrical properties of the circuit may be measured by coupling a suitable electrical measurement device 121 between the second end 120 of the extension wire 118 and a portion of the lightning conductor 26 disposed adjacent to the ground 28. Specifically, in one embodiment, the electrical measurement device 121 may comprise a multimeter, a specialized continuity tester or any other suitable electrical testing/measurement device which is configured to supply a voltage through the circuit formed by the lightning conduction system 20 and measure the resistance, current and/or voltage through the circuit such that it may be determined whether the circuit is opened or closed or whether the lightning conduction system 20 is otherwise functioning properly.

In order to locate the testing device 102 in a position that permits the electrically conductive member 104 to contact one of the lightning receptors 22 of the lightning conduction system 20, the pulley cable 108 of the disclosed system 100 may generally be configured such that, as the pulley cable 108 is pulled or otherwise displaced, the position of the carriage 106 between first and second anchor points 110, 112 may be vertically adjusted. Thus, the pulley cable 108 may generally include a first end 114 and a second end 116 attached to the carriage 106. For example, as shown in the illustrated embodiment, the first end 114 of the pulley cable 108 may be attached to an upper portion of the carriage 106 and the second end 116 of the pulley cable 108 may be attached to a lower portion of the carriage 106. However, it should be appreciated that the ends 114, 116 of the pulley cable 108 may generally be secured to the carriage 106 at any suitable location (including at the same location) and need not be attached to the carriage 106 at the particular locations illustrated in FIG. 2. Additionally, it should be appreciated that the ends 114, 116 of the pulley cable 108 may be attached to the carriage 106 using any suitable attachment mechanism and/or method. For example, in several embodiments, the ends 114, 116 of the pulley cable 108 may be attached by being tied, clipped, glued, taped, bonded, welded and/or mechanically fastened to the carriage 106.

The pulley cable 108 may also be configured to be coupled along its length between the first and second anchor points 110, 112 such that the cable 108 is permitted to move, slide or otherwise be displaced relative to the anchor points 110, 112. Thus, in the illustrated embodiment, when a first side 122 of the pulley cable 108 is pulled or otherwise displaced in a direction towards the second anchor point 112, the carriage 106 is raised relative to the wind turbine 10. Similarly, when a second side 124 of the pulley cable 108 is pulled or otherwise displaced in a direction towards the second anchor point 112, the carriage 106 is lowered relative to the wind turbine 10. Thus, by displacing the pulley cable 108, the vertical positioning of the carriage 106 may be adjusted such that the testing device 102 may be raised and/or lowered to a suitable height for performing the continuity test on the lightning conduction system 20.

Referring still to FIGS. 1 and 2, the first and second anchor points 110, 112 may generally define the maximum and minimum vertical positions for the carriage 106 and the testing device 102, with the pulley cable 108 defining the path along which the carriage 106 and the testing device 102 may be moved between the anchor points 110, 112. As such, it should be appreciated that the first and second anchor points 110, 112 may be spaced apart from one another vertically so that the lightning receptor 22 to be contacted by the electrically conductive member 104 is generally disposed between the anchor points 110, 112. For example, as shown in FIGS. 1 and 2, the first anchor point 110 may generally be disposed on or adjacent to the nacelle 14 and the second anchor point 112 may generally be disposed on or adjacent to the surface 126 on which the wind turbine 10 is supported (e.g., the natural ground/earth and/or any man-made surface, such as a concrete pad). Thus, in one embodiment, the carriage 106 may be raised and/or lowered between the support surface 126 and the nacelle 14, thereby permitting the testing device 102 to be moved onto and/or adjacent to any portion of the rotor blade 16 at which a lightning receptor 22 may be located.

In alternative embodiments, it should be appreciated that the anchor points 110, 112 need not be defined at the locations illustrated in FIGS. 1 and 2. For example, the first anchor point 110 may generally be defined at any suitable location on the wind turbine 10 that is disposed uptower of the lightning receptor 22 to be contacted by the electrically conductive member 104. As used herein, the term "uptower" refers to any location on and/or adjacent to a component of the wind turbine 10 that is vertically above the location of the lightning receptor 22 to be contacted when the rotor blade 16 is facing vertically downward (i.e., when the tip 24 of the rotor blade 16 is pointed towards the support surface 126). Thus, in embodiments in which the lightning receptor 22 to be contacted is disposed generally adjacent the blade tip 24, the first anchor point 110 may be disposed on or adjacent to any suitable wind turbine component or any section of a wind turbine component that is disposed uptower of the tip 24 of the rotor blade 16. Thus, in various embodiments of the present subject matter, the first anchor point 110 may be disposed on or adjacent to the hub 18 and the nacelle 14, as well as on or adjacent to the uptower sections of the tower 12 and the rotor blades 16. Similarly, the second anchor point 112 may generally be disposed at any location relative to the first anchor point 110 that permits the lightning receptor 22 to be made accessible to the testing device 102 as the carriage 106 is moved between the anchor points 110, 112.

In general, it should be appreciated that any suitable structure, device and/or configuration may be utilized within the scope of the present subject matter to couple the pulley cable 108 at the first and second anchor points 110, 112 such that the cable 108 may move, slide or otherwise be displaced relative to the anchor points 110, 112. For example, in one embodiment, the pulley cable 108 may be coupled through one or more pulleys 128, 130 disposed at the first and second anchor points 110, 112, respectively. In particular, a first pulley 128 may be secured to the wind turbine 10 at the first anchor point 110 and may be configured to couple the pulley cable 108 to the wind turbine 10. Thus, in the embodiment of FIG. 2, the first pulley 128 may be attached to a portion of the nacelle 14, such as by being attached to a safety rail 132 disposed on the top of the nacelle 14. Additionally, a second pulley 130 may generally be positioned at or adjacent to the second anchor point 112. For example, as shown, the second pulley 130 may be attached to a pulley anchor 134 secured to the support surface 126 and/or disposed on or adjacent to the support surface 126.

It should be appreciated that the first and second pulleys 128, 130 may generally be attached to the wind turbine 10 or the pulley anchor 134 at the first and second anchor points 110, 112, respectively, using any suitable means known in the art. For instance, as shown in FIG. 2, the first pulley 128 may be attached to the nacelle 14 using an attachment ring or clip 136 (e.g., carabineer). Similarly, the second pulley 130 may be attached to the pulley anchor 134 using an attachment ring or clip 136. However, in alternative embodiments, the pulleys 128, 130 may be attached to the nacelle 14 or pulley anchor 134 using mechanical fasteners (e.g., screws, bolts, brackets and the like), cables, tape, adhesives or using any other suitable attachment mechanism and/or method.

In several embodiments, the pulley anchor 134 of the present subject matter may generally comprise any suitable anchor member which is configured to anchor or otherwise maintain a portion of the pulley cable 108 on or adjacent to the support surface 126. Thus, in the embodiment shown in FIGS. 1 and 2, the pulley anchor 134 may comprise a screw anchor configured to be screwed into or otherwise attached to the support surface 126. In other embodiments, the pulley anchor 134 may comprise any other suitable rope anchors, stakes, tie downs or the like which may be removably or non-removably attached to the support surface 126. Alternatively, the pulley anchor 134 may be configured to be simply disposed on or adjacent to the support surface 126 (i.e., not attached to the support surface 126). For example, the pulley anchor 134 may comprise a relatively heavy object (e.g., sandbags, liquid filled containers, weights, and/or any other suitable weighted objects), a vehicle (e.g., a work truck) or any other suitable item/object that may serve to anchor or otherwise maintain a portion of the pulley cable 108 on or adjacent to the support surface 126. Further, in another embodiment, a service/maintenance worker may serve as the pulley anchor 134 by coupling the pulley cable 108 and/or second pulley 130 to the worker or by having the worker simply hold the pulley cable 108 and/or pulley 130.

It should be appreciated that, in properly positioning the testing device 102 with respect to the rotor blade 16, the location of the pulley anchor 134, the second pulley 130 and/or the pulley cable 108 relative to the wind turbine 10 may be adjusted along the support surface 126 to permit the vertical path and/or the horizontal positioning of the testing device 102 to be altered as the carriage 106 is moved between the first and second anchor points 110, 112. As such, the testing device 102 may be properly oriented with respect to the rotor blade 16 and/or the lightning receptor 22 as the carriage 106 is raised and/or lowered. For example, the pulley anchor 134 may be configured to be moved closer to and/or further away from the wind turbine tower 12 and/or to be moved around the circumference of the tower 12 to alter the position of the second anchor point 112 and, thus, adjust the travel path of the carriage 106 with respect to the rotor blade 16 and/or the lightning receptor 22 to be contacted. Additionally, in embodiments in which a service/maintenance worker serves as the pulley anchor 134, the worker may simply walk along the support surface 126 to permit the rotor blade 16 and/or the lightning receptor 22 to be accessible to the testing device 102 as the carriage 106 is raised and/or lowered.

It should also be appreciated that, although the present subject matter is generally described as utilizing pulleys 128, 130 to allow the pulley cable 108 to move, slide or otherwise be displaced relative to the anchor points 110, 112, any suitable structure, device and/or configuration may generally be utilized to permit such relative displacement. For example, the pulley cable 108 may be coupled to the wind turbine 10 and/or the pulley anchor 134 by inserting the pulley cable 108 through a guide ring, guide hook, eyelet or any other suitable structure formed on or attached to the wind turbine 10 or pulley anchor 134 which permits the pulley cable 108 to be slidably and/or movably attached thereto. In another embodiment, the pulley cable 108 may be coupled to the wind turbine 10 and/or the pulley anchor 134 using a motorized device, a winch, a sprocket arrangement, or any other suitable device/mechanism that permits the pulley cable 108 to be displaced relative to the anchor points 110, 112. Various other suitable structures, devices and/or configurations for providing relative displacement between the pulley cable 108 and the anchor points 110, 112 should be apparent to those of ordinary skill in the art.

Referring still to FIG. 2, as indicated above, the carriage 106 of the disclosed system may generally be configured to transport the testing device 102 between the first and second anchor points 110, 112. As such, it should be appreciated that the carriage 106 may generally have any suitable size, shape and/or dimensions that permits the pulley cable 108 and the testing device 102 to be secured thereto. For example, as shown in FIG. 2, the carriage 106 may be configured as a relatively thin plate having a substantially diamond shape. However, in alternative embodiments, the carriage 106 may generally have any suitable thickness and/or shape. Additionally, the carriage 106 may generally be formed from any suitable material. However, in a particular embodiment of the present subject matter, the carriage 106 may be formed from a relatively lightweight material (e.g., aluminum, wood, polymers and/or any other suitable lightweight materials) so as to reduce the overall weight of the system. Further, it should be appreciated that the testing device 102 may generally be secured to the carriage 106 using any suitable means. For example, as shown in FIG. 2, the testing device 102 may be directly attached to the carriage 106 at one or more attachment points using any suitable attachment mechanism, such as bolts, screws, clips, tape, glue, brackets and the like, and/or using any suitable attachment method, such as bonding, welding and the like. Alternatively, the testing device may be indirectly attached to the carriage using one or more mounting devices and/or mounting platforms (not shown).

It should also be appreciated that, in an alternative embodiments of the present subject matter, the testing device 102 need not be coupled to the pulley cable 108 through the carriage 106. For instance, in one embodiment, the first and second ends 114, 116 of the pulley cable 108 may be attached directly to the testing device 102.

Referring now to FIG. 3, there is illustrated a perspective view of one embodiment of a testing device 102 for performing a continuity test on the lightning conduction system 20 of a wind turbine 10. In general, it should be appreciated that the testing device 102 of the present subject may generally have any suitable configuration that permits an electrically conductive member 104 of the testing device 102 to be positioned onto or to otherwise make contact with a lightning receptor 22 of the lightning conduction system 20. Thus, one of ordinary skill in the art should appreciate that various different testing device configurations may be utilized within the scope of the present subject matter.

As shown in the illustrated embodiment, the testing device 102 generally includes a support member 138 and a blade ring 140. The support member 138 may generally comprise any suitable structural member configured to support the blade ring 140 as the testing device 102 is raised and/or lowered using the carriage 106 of the disclosed system 100. Thus, the support member 138 may generally include a first end 142 configured to be attached to the carriage 106 and a second end 144 configured to be attached to the blade ring 140. For example, as shown in FIG. 3, one or more mounting holes 146 may be defined in the first end 142 of the support member 138 to permit the support member 138 to be attached at attachment points 148 (FIG. 2) on the carriage 106 using any suitable mechanical fasteners, such as bolts, screws and the like. Alternatively, the first end 142 of the support member 138 may be attached to the carriage 106 using any other suitable means, such as by using any suitable attachment mechanism (e.g., clips, tape, glue, adhesives, brackets and the like) and/or using any suitable attachment method (e.g., bonding, welding and the like). Further, in embodiments in which the presently disclosed system does not include a carriage 106 and the testing device 102 is coupled or otherwise attached directly to the pulley cable 108, it should be appreciated that the first end 142 of the support member 138 may generally be configured to be attached to the first and second ends 114, 116 of the pulley cable 108, such as by using the attachment means and/or the attachment method otherwise used to attach the carriage 106 to the pulley cable 106.

Additionally, the second end 144 of the support member 138 may generally be configured to be attached to the blade ring 140 using any suitable means, such as by using the attachment mechanisms and/or methods described above. However, in a particular embodiment of the present subject matter, the second end 144 of the support member 138 may be configured to be pivotally attached to the blade ring 140 using any means that permits the blade ring 140 to pivot or otherwise move about its attachment point 150 on the support member 138. For example, the blade ring 140 may be secured to the support member 138 using a ball and socket, by loosely attaching the blade ring 140 onto a pin or bolt extending through the support member 138 or using any other suitable pivotal attachment mechanism and/or method. Further, in embodiments in which the blade ring 140 is pivotally attached to the support member 138, a tensioning device 152 may also be coupled between the blade ring 140 and the support member 138 to exert a resistant force against the blade ring 140, thereby providing a mechanism for controlling the position of the blade ring 140 relative to the support member 138. For example, as shown in FIG. 3, the tensioning device 152 may comprise a spring coupled between the blade ring 140 and support member 138 to enable the position of the blade ring 140 relative to the support member 138 to be controlled as the ring 140 pivots or rotates about the attachment point 150.

It should be appreciated that, in alternative embodiments of the present subject matter, the support member 138 and the blade ring 140 need not be formed as separate components. For instance, in one embodiment, the support member 138 and the blade ring 140 may be formed integrally as a single component using any suitable manufacturing process, such as any suitable molding and/or casting process.

Referring still to FIG. 3, the blade ring 140 of the testing device 102 may generally be configured to slide onto, fit over or otherwise be positioned around at least a portion of a rotor blade 16 of the wind turbine 10. Specifically, the blade ring 140 may be configured such that, when the ring 140 positioned onto the rotor blade 16, the electrically conductive member 104 of the blade ring 140 makes electrical contact with a lightning receptor 22 of the lightning conduction system 20. Accordingly, it should be appreciated that the shape, size and/or configuration of the blade ring 140, as well as the relative positioning of the electrically conductive member 104 on the blade ring 140, may generally vary from wind turbine to wind turbine depending on numerous factors including, but not limited to, the shape, size and/or configuration of the rotor blade 16 and the positioning of the lightning receptors 22 on the rotor blade 16.

In several embodiments of the present subject matter, the blade ring 140 may have as a closed shape (i.e., a shape that can be traced using the same starting and stopping points) so as to be configured to be positioned around the entire outer perimeter of the rotor blade 16. In particular, the blade ring 140 may be configured such that the tip 24 of the rotor blade 16 must be aligned within or must otherwise extend through the blade ring 140 in order to permit the blade ring 140 to be positioned onto the rotor blade 16 as the testing device 102 is raised using the disclosed system 100. Thus, as shown in FIG. 3, in one embodiment, the blade ring 140 may have a substantially elliptical shape generally corresponding to the shape of the rotor blade 16 in the area adjacent to the blade tip 24. In other embodiments, the blade ring 140 may generally have any other suitable closed shape configuration, such as by having a circular, rectangular or triangular shape. It should be appreciated that, in further embodiments of the present subject matter, the blade ring 140 may have a generally non-closed or open shape. For example, the blade ring 140 may be semi-circular shaped, "C" shaped or have any other suitable open shaped configuration. As such, the blade ring 140 may be positioned onto or around the portion of the outer perimeter of the rotor blade 16 at which the lightning receptor 22 is disposed without aligning or otherwise extending the tip 24 of the rotor blade 16 within the blade ring 140 as the testing device 102 is raised relative to the wind turbine 10.

Additionally, in several embodiments of the present subject matter, the height 154, width 156 and/or other dimensions of the blade ring 140 may be chosen such that the ring 140 may only be positioned around the rotor blade 16 up to the location of the lightning receptor 22. For example, in one embodiment, the dimensions of the blade ring 140 may be configured such that the inner surface 158 of the ring 140 fully engages the outer perimeter of the rotor blade 16 as the ring 140 is brought into vertical alignment with the lightning receptor 22, thereby preventing the ring 140 from being raised further along the blade 16. Moreover, in several embodiments, the dimensions and/or shape of the blade ring 140 may be fixed or may be adjustable. Thus, in one embodiment, the blade ring 140 may be configured such that the height 154 and/or width 156 of the ring 140 may be increased or decreased so as to generally correspond to the size, shape and/or configuration of the rotor blade 16 at the location of the lightning receptor 22. For example, the sides 160 of the blade ring 140 may be telescoping or may include other suitable adjustment features to permit the height 154 of the ring 140 to be adjusted. Similarly, the ends 162 of the blade ring 140 may include an adjustable spacer or any other suitable mechanism that permits the width 156 or spacing between the sides 160 of the blade ring 140 to be increased and/or decreased. In another embodiment, the blade ring 140 may be formed from a flexible and/or expandable material such that the shape and/or size of the ring 140 may be adapted to the shape and/or size of the rotor blade 16 as it is raised onto or otherwise placed around the rotor blade 16.

Referring still to FIG. 3, the electrically conductive member 104 of the testing device 102 may generally comprise any suitable object formed from an electrically conductive material that is capable of forming an electrical connection or otherwise making electrical contact with a lightning receptor 22 of the lightning conduction system 20. Thus, in several embodiments, the electrically conductive member 104 may comprise any suitable metal or metal-containing object extending outwardly from the inner surface 158 of the blade ring 140 such that it may contact the lightning receptor 22 as the testing device 102 is positioned onto the rotor blade 16. For example, in the illustrated embodiment, the electrically conductive member 104 may comprise a metal wire brush, such as a copper wire brush, disposed on the interior surface of the blade ring and extending outwardly therefrom. It should be appreciated that, although a single electrically conductive member 104 is shown as being attached to the blade ring 140, any number of electrically conductive members 104 may be secured to blade ring 140 at any suitable location, such as at any location along the inner perimeter of the blade ring 140.

It should also be appreciated that the electrically conductive member 140 may generally be attached to the inner surface 158 of the blade ring 140 using any suitable means, such as by using any suitable attachment mechanism (e.g., bolts, screws, clips, tape, glue, brackets and the like) and/or using any suitable attachment method (e.g., bonding, welding and the like). However, in a particular embodiment of the present subject matter, the electrically conductive member 104 may be configured to be removably attached to the inner surface 158 such that the location of the electrically conductive member 104 on such surface 158 of the blade ring 140 may be adjusted to account for variations in the positioning of the lightning receptors 22 on ant particular rotor blade 16. Alternatively, the blade ring 140 may include an adjustment feature (not shown) that permits the position of the electrically conductive member 104 to be altered along the inner surface 158 of the blade ring 140. For instance, the electrically conductive member 104 may be attached within a slot defined in one or both of the sides 160 of blade ring 140 so that the position of the electrically conductive member 104 may be adjusted by simply re-positioning the member 104 along the slot.

Additionally, in a particular embodiment of the present subject matter, the testing device 102 may also include a voltage source (not shown), such as a battery or other power source, mounted to a portion of the testing device 102 and electrically coupled to the electrically conductive member 104. In such an embodiment, the testing device 102 may be configured to transmit an electrical current through the electrically conductive member 104 to the lightning receptor 22 when the member 104 is placed in contact with the receptor 22. As such, the continuity of the lightning conduction system 20 may be tested by measuring an electrical property of the system, such as by measuring the resistance in the lightning conductor 26 adjacent to the ground 28, without extending the extension wire 118 from the electrically conductive member 104 to the support surface 126.

Referring now to FIG. 4, there is illustrated a side view of another embodiment of a system 200 for performing a continuity test on the lightning conduction system 20 of a wind turbine 10. In general, the illustrated system 200 may include the same or similar components and may be configured similarly to the system 100 described above with reference to FIGS. 1 and 2. Thus, the system 200 may include a continuity testing device 102 attached to a carriage 106. Additionally, the system 200 may include a pulley cable 108 having first and second ends 114, 116 attached to the carriage 106. The carriage 106 may generally be configured to transport the testing device 102 between first and second anchor points 110, 112. Further, the pulley cable 108 may generally be coupled along its length between the first and second anchor points 110, 112 (e.g., by using pulleys 128, 130 attached to the nacelle 14 and a pulley anchor 134, respectively) such that the pulley cable 108 is permitted to move, slide or otherwise be displaced relative to the anchor points 110, 112.

In addition, as shown in FIG. 4, the disclosed system 200 may also include one or more secondary cables 242 coupled to the carriage 106 and extending from an area generally adjacent the first anchor point 110 to an area generally adjacent the second anchor point 112. The secondary cables 242 of the present subject matter may generally be configured to permit the orientation and/or position of the testing device 102 to be controlled as the carriage 106 is raised and/or lowered by the pulley cable 108. For example, the secondary cables 242 may be utilized to stabilize and/or guide the carriage 106 as it is being moved between the anchor points 110, 112, thereby preventing the carriage 106 and the testing device 102 from rotating during windy conditions. Additionally, in one embodiment, the secondary cables 242 may be coupled to the carriage 106 such that a frictional interface exists between the secondary cables 242 and the carriage 106. As such, the secondary cables 242 may be utilized to control the speed at which the carriage 106 is raised and/or lowered and may also be utilized to adjust the position of the carriage 106 relative to the rotor blade 16 and/or the lightning receptor 22. It should be appreciated that, although two secondary cables 242 are shown in FIG. 4, the disclosed system may generally include any number of secondary cables 242, including a single secondary cable 242 or three or more secondary cables 242.

In one embodiment, each secondary cable 242 may be coupled to the carriage 106 using a cable guide 244 attached to or defined by the carriage 106. The cable guides 244 of the present subject matter may generally have any configuration which permits the secondary cables 242 to serve as a means for guiding and/or controlling the carriage 106 as it is raised or lowered by the pulley cable 108. For example, in the embodiment illustrated in FIG. 4, each cable guide 244 may comprise a set of fixed friction studs 246 secured to the carriage 106. In general, the friction studs 246 may be arranged on the carriage 106 such that a secondary cable 242 must be snaked or otherwise wrapped around the studs 246 in order to couple the secondary cable 242 to the carriage 106. Such an arrangement may generally result in the secondary cables 242 providing a frictional or resistant force against the movement of the carriage 106 as it is raised and/or lowered, thereby permitting the secondary cables 242 to function as a control and/or guide means for the carriage 106 and the testing device 102. Thus, in one embodiment, the inner diameters 248 of the friction studs 246, about which secondary cables 242 are wrapped, may be varied to increase or decrease the friction provided between the studs 248 and the secondary cables 242 as the carriage 106 is raised and/or lowered. For example, as shown in FIG. 3, each cable guide 244 may include three friction studs 246, with the outer studs 246 having a larger inner diameter 248 than the middle stud. As such, the contact area between the middle stud 246 and the secondary cable 242 may be reduced, thereby reducing the amount of friction. Additionally, in another embodiment the friction studs 246 may be secured to the carriage 106 in an offset configuration to increase or decrease the friction created, such as by offsetting one or more of the studs 246 in a horizontal direction 250 relative to the other studs 246.

It should be appreciated that the friction studs 246 may generally comprise any structure about which the secondary cables 242 may be wrapped in order to couple the cables 242 to the carriage 106. For example, in one embodiment, the friction studs 246 may be configured as fixed pulleys secured to the carriage 106. Alternatively, the friction studs 246 may comprise a bolt, stud, pin or any other structure that is configured to couple the secondary cables 242 to the carriage 106. It should also be appreciated that, although each cable guide 244 is depicted as including three friction studs 246, the cable guides 244 may generally include any number of friction studs 246, such as two friction studs 246 or four or more friction studs 246. Additionally, the friction studs 246 may be secured to the carriage 106 using any suitable means. For example, the friction studs 246 may be attached to the carriage 106 using mechanical fasteners 140, such as screws, bolts or the like. Alternatively, the friction studs 246 may be attached to the carriage 106 using any other suitable attachment mechanism, such as tape, cables, clips, adhesives, brackets and the like, or using any suitable attachment method, such as by welding, bonding and the like.

Further, in several embodiments of the present subject matter, the cable guides 244 need not comprise friction studs 246 but may generally comprise any structure that permits the secondary cables 242 to serve as a means for guiding and/or controlling the carriage 106 as it is raised and/or lowered by the pulley cable 108. For instance, in another embodiment, each cable guide 244 may comprise two or more openings or friction rings defined in the carriage 106. The secondary cables 242 may then be threaded through each friction ring in order to couple the cables 242 to the carriage 106. As is generally known in the rope climbing art, such friction rings are commonly utilized in climbing equipment (e.g., in rigging plates) to provide controlled friction between the equipment and the climbing rope. Additionally, in further embodiments of the present subject matter, each cable guide 244 may simply comprise a vertically extending channel defined within the carriage 106 through which a secondary cable 242 may be inserted.

Referring still to FIG. 4, each secondary cable 242 may be fixed at a top end 252 to a component of the wind turbine 10 (FIG. 1). For example, in one embodiment, the top ends 252 of the secondary cables 242 may be attached to the wind turbine 10 generally adjacent to the first anchor point 110. Thus, as shown, the top ends 252 of the secondary cables 242 may be secured to a portion of the nacelle 14, such as to the safety rail 132. However, in an alternative embodiment, the top ends 252 of the secondary cables 242 may be secured to a portion of the wind turbine 10 such that a distal relationship exists between the secondary cables 242 and the first anchor point 110.

The secondary cables 242 may also include a bottom end 254 disposed generally adjacent to the support surface 126 and/or the second anchor point 112. For example, in one embodiment, the bottom ends 254 of the secondary cables 242 may be disposed directly adjacent to the second anchor point 112, such as by being secured to a portion of the pulley anchor 134. Alternatively, as shown in FIG. 4, the bottom ends 254 of the secondary cables 242 may be attached to separate guide anchors 256 disposed generally adjacent the support surface 126 and/or the first anchor point 112.

It should be appreciated that the guide anchors 256 may generally be configured similarly to the pulley anchor 134 described above with reference to FIGS. 1 and 2. Thus, the guide anchors 256 may be configured to be removably or non-removably attached to the support surface 126 or may be configured to be disposed on or adjacent to the support surface 126 (i.e., not attached to the support surface 126). Alternatively, one or more service/maintenance workers may serve as the guide anchor(s) 256 and simply hold onto the secondary cables 242 as the carriage 106 is being raised and/or lowered. Additionally, similar to the pulley anchor 134, the position of the guide anchors 254 relative to the wind turbine 10 may be adjustable to facilitate guiding and/or controlling the orientation and/or position of the carriage 106 as it is raised and/or lowered.

One of ordinary skill in the art should appreciate that the first anchor point 110 of the systems 100, 200 disclosed herein may generally be established by having a service/maintenance worker climb up the wind turbine 10 and attach or otherwise couple the pulley cable 108 to the wind turbine 10. For example, in the illustrated embodiments, the worker may climb onto the nacelle 14 of the wind turbine 10 and attach the first pulley 128 to a portion of the nacelle 14. Once the continuity test has been performed on the lightning conduction system 20 of the wind turbine 10, it may be desirable to detach or otherwise remove the presently disclosed system 100, 200 from the wind turbine 10 so that it may be transported to another wind turbine. Thus, in one embodiment, the worker may climb back up the wind turbine 10 and detach or otherwise remove the pulley cable 108 and/or first pulley 128 from the wind turbine 10.

Alternatively, the disclosed systems 100, 200 may be configured so as to remove the necessity for a second trip back up the wind turbine 10. For example, the pulley cable 108 and/or first pulley 128 may be held in place at the first anchor point 110 by a separate attachment cable (not shown) wrapped around or otherwise coupled to a component of the wind turbine 10 and extending down to the support surface 126. Thus, in the embodiment illustrated in FIGS. 1 and 2, the first pulley 128 may be attached to a separate attachment cable wrapped around the safety rail 132 of the nacelle 14 (or any another suitable component of the nacelle 14) and attached or otherwise disposed adjacent to the support surface 126. As such, when the continuity test being performed on the wind turbine 10 has been completed, the separate attachment cable may simply be detached from the support surface 126 and the entire system, including the separate attachment cable, may be pulled down to the support surface 126. In another embodiment, a motorized winch or similar device (not shown) may be secured to the wind turbine 10 at the first anchor point 110 and may be configured to automatically raise and lower an attachment cable (not shown) wrapped around its spindle. As such, when a continuity test is desired to be performed on the wind turbine 10, the winch may be configured to lower the attachment cable to the support surface 126. The pulley cable 108 and/or first pulley 128 may then be secured to the attachment cable and raised by the winch to the first anchor point 110. Once the test has been completed, the winch may again unwind the attachment cable to permit the pulley cable 108 and/or first pulley 128 to be detached from the attachment cable.

It should also be appreciated that, as used herein, the term "cable" refers to any length of material which may be configured to function as described herein. As such, the cables 108, 242 of the present subject matter may include any suitable cables, wires, ropes, chains or lines formed from any suitable material. For example, in one embodiment, the cables 108, 242 may comprise rope formed from twisted, braided or woven natural fibers (e.g., hemp and cotton) or synthetic fibers (e.g., polypropylene, nylon and polyesters). In other embodiments, the cables 108, 242 may comprise coated or non-coated, flexible or non-flexible metal cables and/or chains.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for performing a continuity test on a lightning conduction system of a wind turbine, the system comprising:
    a testing device including a blade ring and an electrically conductive member attached to the blade ring, the blade ring being configured to be positioned around at least a portion of an outer perimeter of a rotor blade of the wind turbine;
    a carriage attached to the testing device; and,
    a cable having a first end and a second end attached to the carriage and extending between a first anchor point and a second anchor point, the first and second anchor points being spaced apart from one another such that a lightning receptor of the lightning conduction system is generally disposed between the first and second anchor points,
    wherein the cable is coupled between the first and second anchor points such that, as the cable is displaced, the testing device is moved to a position at which the electrically conductive member contacts the lightning receptor.

2. The system of claim 1, wherein the testing device comprises a support member, the support member having a first end attached to the carriage and a second end attached to the blade ring.

3. The system of claim 2, wherein the blade ring is pivotally attached to the second end of the support member.

4. The system of claim 3, wherein a tensioning device is coupled between the blade ring and the support member.

5. The system of claim 1, wherein the blade ring defines a closed shape configured to be positioned around an entire outer perimeter of the rotor blade.

6. The system of claim 5, wherein at least one of a height and a width of the blade ring is configured such that an inner surface of the blade ring engages an outer perimeter of the rotor blade when the electrically conductive member is vertically aligned with the lightning receptor.

7. The system of claim 1, wherein the electrically conductive member comprises a metal wire brush attached to an inner surface of the blade ring.

8. The system of claim 1, further comprising a wire having a first end attached to the electrically conductive member and a second end disposed generally adjacent to a support surface of the wind turbine.

9. The system of claim 8, further comprising an electrical measurement device coupled between the second end of the wire and a component of the lightning conduction system, the electrical measurement device being configured to measure an electrical property of the lightning conduction system.

10. The system of claim 1, wherein the first anchor point is disposed on a nacelle of the wind turbine and the second anchor point is disposed generally adjacent to a support surface of the wind turbine.

11. The system of claim 1, wherein a first pulley is attached to the wind turbine at the first anchor point and a second pulley is attached to a pulley anchor at the second anchor point, the cable being coupled between the first and second pulleys such that, as the cable is displaced, the testing device is moved to a position at which the electrically conductive member contacts the lightning receptor.

12. The system of claim 1, further comprising a secondary cable coupled to the carriage through a cable guide, the secondary cable extending from generally adjacent the first anchor point to generally adjacent the second anchor point.

13. A method for performing a continuity test on a lightning conduction system of a wind turbine, the method comprising:
coupling a cable between a first anchor point and a second anchor point, the first anchor point being spaced apart from the second anchor point such that a lightning receptor of the lightning conduction system is generally disposed between the first and second anchor points;
coupling the cable to a testing device; and,
displacing the cable so that the testing device is moved to a position between the first and second anchor points at which an electrically conductive member of the testing device contacts the lightning receptor.

14. The method of claim 13, further comprising connecting a wire to the electrically conductive member such that an electrical connection is formed between the wire and the lightning conduction system when the electrically conductive member contacts the lightning receptor.

15. The method of claim 14, further comprising measuring an electrical property between the wire and a component of the lightning conduction system.

16. The method of claim 14, wherein the wire generally extends between the electrically conductive member and a support surface of the wind turbine.

17. The method of claim 13, further comprising adjusting a position of at least one of the first anchor point and the second anchor point such that, as the cable is displaced, the testing device is moved to a position at which the electrically conductive member contacts the lightning receptor.

18. The method of claim 13, further comprising aligning a tip of a rotor blade of the wind turbine within a blade ring of the testing device such that, as the cable is displaced, the testing device is moved to a position at which the electrically conductive member contacts the lightning receptor.

19. The method of claim 18, wherein at least one of a height and a width of the blade ring is configured such that an inner surface of the blade ring engages an outer perimeter of the rotor blade when the electrically conductive member is vertically aligned with the lightning receptor.

20. A testing device for performing a continuity test on a lightning conduction system of a wind turbine, comprising:
a support member;
a blade ring attached to the support member, the blade ring being configured to be positioned around at least a portion of an outer perimeter of a rotor blade of the wind turbine; and,
an electrically conductive member attached to an inner surface of the blade ring,
wherein the electrically conductive member is configured to contact a lightning receptor of the lightning conduction system when the blade ring is positioned around the at least a portion of the outer perimeter of the rotor blade.

* * * * *